United States Patent [19]

Schach et al.

[11] Patent Number: 4,827,329
[45] Date of Patent: May 2, 1989

[54] SEMICONDUCTOR ARRAY

[75] Inventors: Robert Schach, Talheim; Peter Scholl, Nordheim, both of Fed. Rep. of Germany

[73] Assignee: Telefunken electronic GmbH, Heilbronn, Fed. Rep. of Germany

[21] Appl. No.: 915,803

[22] Filed: Oct. 6, 1986

[30] Foreign Application Priority Data

Oct. 5, 1985 [DE] Fed. Rep. of Germany ....... 3535605

[51] Int. Cl.[4] ..................... H01L 23/02; H01L 39/02; H01R 13/44
[52] U.S. Cl. ......................................... 357/81; 357/74; 357/80; 439/374
[58] Field of Search ................ 357/81, 80, 74; 339/36

[56] References Cited

U.S. PATENT DOCUMENTS

| 2,729,797 | 1/1956 | Kobler et al. | 339/36 |
| 3,893,161 | 7/1975 | Pesak, Jr. | 357/81 |
| 4,041,524 | 8/1977 | Trunk et al. | 357/81 |
| 4,054,901 | 10/1977 | Edwards et al. | 357/81 |
| 4,215,361 | 7/1980 | McCarthy | 357/81 |
| 4,270,138 | 5/1981 | Desmond | 357/80 |
| 4,503,452 | 3/1985 | Yokozawa et al. | 357/74 |

Primary Examiner—Andrew J. James
Assistant Examiner—Gregory A. Key
Attorney, Agent, or Firm—Spencer & Frank

[57] ABSTRACT

In a semiconductor array having a plastic casing and a cooling portion which is at least partly not embedded in the plastic, an insulating portion is provided which is designed to slide onto the cooling portion and to provide at least partial electrical insulation of the cooling portion when slid on.

19 Claims, 2 Drawing Sheets

SEMICONDUCTOR ARRAY

BACKGROUND OF THE INVENTION

The invention relates to a semiconductor array having a plastic casing and a cooling portion which is at least partly not embedded in the plastic.

Electrical equipment is today preferably fitted with semiconductor components such as transistors or integrated circuits with the aid of automatic machinery. Semiconductor components with platic casings and suitable for clip assembly are particularly well suited for automatic fitting.

Power components such as power transistors which are embedded in plastic casings have, as is known, cooling plates on their undersides to cool the semiconductor component. When installing a power transistor with plastic casing and cooling plate, two cases must be distinguished: in one case the cooling plate is mounted insulated on a base, for example a chassis or cooling sheet, while in the other case the cooling plate is mounted uninsulated on a base. In the second case, the cooling plate has the same potential as the base. If a semiconductor component has to be mounted insulated on a base so that it does not assume the potential of the base, materials with good thermal conductivity and electrical insulation properties are required, and must be mounted in strips between the cooling plate and the base (cooling sheet). It is obvious that this type of mounting is not conductive to easy fitting.

For that reason, the method was introduced of using, in the case where a power transistor has to be mounted insulated on the base, power transistors completely embedded in plastic casings together with their cooling plates, and, in the other case where no insulation is necessary between cooling plate and cooling sheet or base on which the transistor is mounted, transistors in which the cooling plates are not surrounded by plastic at least on their undersides.

According to the prior art, therefore, two different plastic casings and so two different production lines are necessary, depending on the application, requiring high investment costs.

SUMMARY OF THE INVENTION

The object underlying the invention is to provide a solution that involves a substantial simplification and lower costs as compared to the prior art. According to the invention, an insulating portion is provided in a semiconductor array having plastic casing and cooling portion, said insulating portion being designed to slide into the cooling portion and, when slid on, to provide at least a partial electrical insulation of the cooling portion.

The word "partial" does not refer to the electrical insulation, which should, of course, be complete and as effective as possible, but to the surface proportion of the insulating portion. The word "partial" is to express that it is not the entire surface of the cooling portion that is to be insulated with the insulating portion, but, for example, only those surfaces facing the base (cooling sheet) on which the components have been mounted.

The invention has the advantage that the casing structure can be identical for both cases, regardless of whether the cooling portion (cooling plate) is to be mounted insulated or uninsulated on its base (cooling sheet), since, when insulation is required, only the insulating portion according to the invention has to be slid onto the cooling portion. The insulating portion according to the invention is located, unlike the previously used insulating strips, firmly on the cooling portion, which is preferably designed as a cooling plate, and its firm mounting (press fit) is in no way detrimental to automatic fitting, so that the fitting process when an insulating portion according to the invention is used is practically identical to that with a plastic casing in which not only the transistor but also the cooling plate is embedded.

BRIEF DESCRIPTION OF THE DRAWINGS

The invention will now be described in greater detail, by way of examples, with reference to the drawings, in which.

DESCRIPTION OF THE PREFERRED EMBODIMENTS

Figure 1:
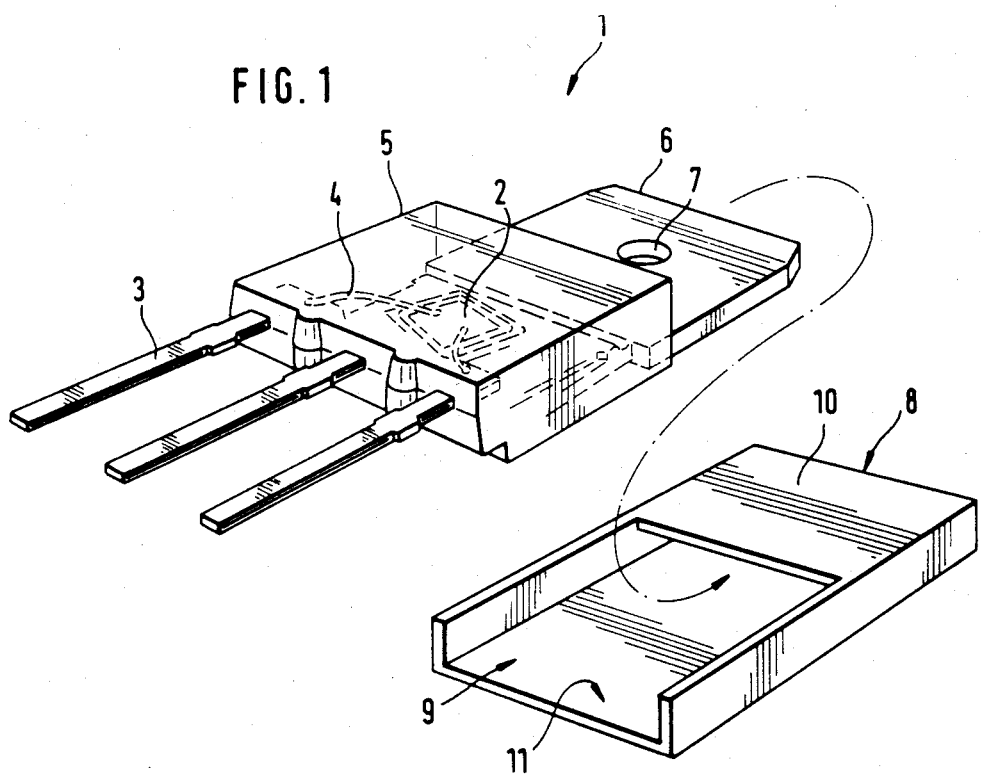
FIG. 1 shows a power transistor with cooling plate and insulating portion.

FIG. 1 shows a power transistor 1 with semiconductor element 2, power lines 3, connecting wires 4, plastic casing 5 comprising an electrically insulating plastic, and cooling plate 6. Cooling plate 6 is only partially embedded in the plastic 5. The plastic 5 covers only part of the upper surface of cooling plate 6 (about two thirds) and part of the lateral surfaces of cooling plate 6. The right-hand part (about one third) of cooling plate 6 is not covered by plastic at all, and this applies too to the entire underside (lower surface) of cooling plate 6. The part of cooling plate 6 not covered by plastic 5 has a hole 7 for fastening cooling plate 6 and thus power transistor 1 to a base (e.g. cooling sheet).

Figure 2:
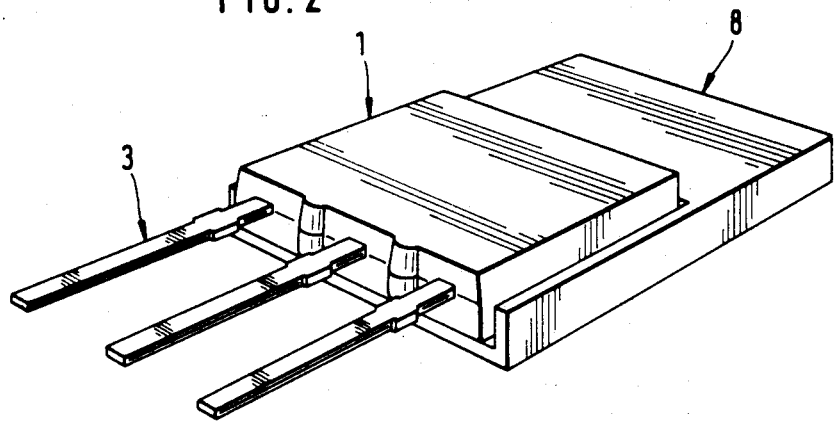
FIG. 2 shows the power transformer with slid-on insulating portion.

In order that the power transistor in FIG. 1 can be mounted on a base not only uninsulated but also insulated in a simple manner, a slipper-shaped or "flip-flop"-shaped insulating portion 8 is provided according to FIG. 1, said insulating portion being slid, as shown in FIG. 2, in a press fit onto cooling plate 6 in such a way that the entire portion of cooling plate 6 not covered by plastic is covered by the insulating portion 8 and is thereby electrically insulated. If the transistor of FIG. 2 is mounted with insulating portion 8 onto a base, such as, for example, a chassis or cooling sheet, cooling plate 6 and thus transistor 1 are electrically insulated from the base and are therefore not on the potential of the base. Insulating portion 8 is preferably designed as thin as possible to keep its thermal resistance as low as possible and for the heat from cooling plate 6 to be carried off as well as possible via insulating portion 8. It must, of course, be ensured that the insulating portion provides sufficient electrical insulation. The expression "slipper-shaped" or "flip-flop-shaped" or "shoe-shaped" according to FIG. 1 means that insulating portion 8 is designed in casing form to a certain extent but with one lateral surface 9 and part of surface 10 missing. Stated another way, insulating portion 8 has three lateral surfaces and two surfaces of which one (10) only partially covers the other (11). The two surfaces 10, 11 of the insulating portion are designed rectangular, and this applies to the existing lateral surfaces of insulating portion 8, too.

Figure 3:
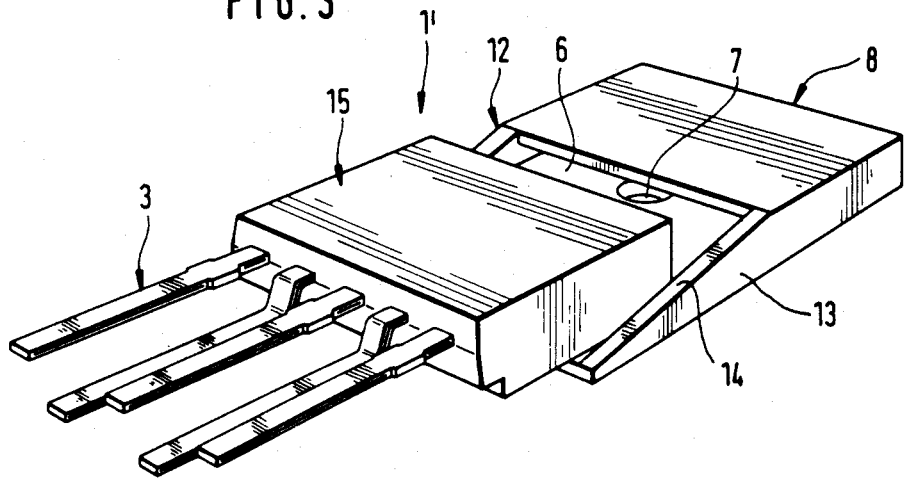
FIG. 3 shows an integrated circuit.

FIG. 3 differs from FIGS. 1 and 2 substantially only in that an integrated circuit 1' is provided instead of power transistor 1. In other respect that are largely identical, i.e in FIG. 3 insulating portion 8 according to the invention is also provided and slid onto cooling plate 6. In contrast to the insulating portion of FIGS. 1 and 2, the two parallel lateral surfaces 12 and 13 of insulating portion 8 have a slope 14, which can, of course, also be used in the insulating portions in FIGS. 1 and 2.

Figure 4:
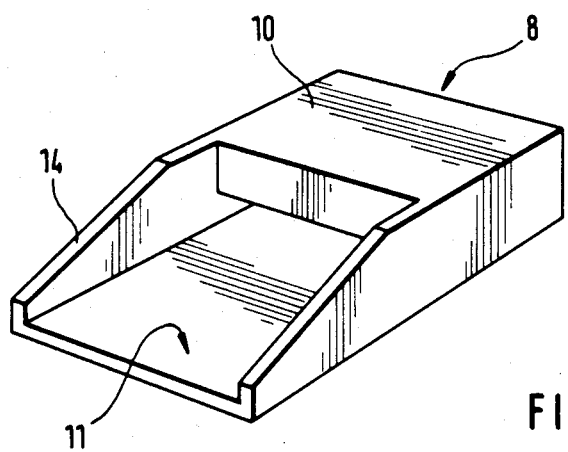
FIG. 4 shows a power transistor with a thick insulating portion.

FIG. 4 finally shows a further embodiment of the invention which differs from the other embodiments in that the upper surface 10 of insulating portion 8 is designed thicker, such that this surface is level with that surface 15 of the plastic casing facing away from cooling plate 6.

What is claimed is:

1. A semiconductor array having a plastic casing; a cooling member partly embedded in the plastic; and an insulating portion configured to slidably receive the cooling member and electrically insulate at least a portion thereof.

2. A semiconductor array according to claim 1, wherein the insulating portion is mounted on the cooling member and presses against the cooling member when slid on.

3. A semiconductor array according to claim 1, wherein the cooling member is a cooling plate which is arranged on the underside of the plastic casing, and the plastic casing covers only part of the cooling plate.

4. A semiconductor array according to claim 1, wherein the insulating portion is designed as an open-ended casing having a bottom surface, a top surface that is smaller than the bottom surface, and a pair of spaced-apart lateral surfaces connecting the top and bottom surfaces.

5. A semiconductor array according to claim 4, wherein the top surface is spaced apart from the open end.

6. A semiconductor array according to claim 1, wherein the insulating portion has three lateral surfaces and two surfaces, of which one only partially covers the other.

7. A semiconductor array according to claim 1, wherein the surfaces of the insulating portion are designed rectangular.

8. A semiconductor array according to claim 1, wherein the insulating portion has three lateral surfaces and two further surfaces, one of which is smaller than the other and only partially covers the other, and wherein two of the three lateral surfaces of the insulating portion are parallel, and these parallel lateral surfaces have respective edges which slope in the direction of the larger of the two further surfaces.

9. A semiconductor array according to claim 1, wherein the insulating portion comprises an elongated bottom surface having first and second ends, a top surface that is smaller than the bottom surface, and connection means for mounting the top surface adjacent the first end of the bottom surface so as to cover a portion of the bottom surface, the top surface being spaced apart from the bottom surface.

10. A semiconductor array, comprising:
   an active circuit element which includes
      a semiconductor member,
      a plastic casing for the semiconductor member, the plastic casing having generally rectangular top and bottom sides and first and second spaced-apart lateral sides which join the top and bottom sides, the plastic casing additionally having third and fourth lateral sides which join the top and bottom sides and which extend between the first and second lateral sides,
      a cooling plate mounted at the bottom side of the plastic casing, the cooling plate having an outer portion which extends beyond the first lateral side of the plastic casing, the outer portion terminating in an outer end, and
      a plurality of leads connected to the semiconductor member, the leads extending through the second lateral side of the plastic casing; and
   an electrically insulating sleeve having a mouth opening to slidably receive the active circuit element and having wall means frictionally engaging the active circuit element to retain the active circuit element in the sleeve, the wall means including
      a bottom wall below the cooling plate and the bottom side of the plastic casing, the bottom wall extending from a position adjacent the outer end of the cooling plate to a position adjacent the second lateral side of the plastic casing,
      a top wall above the outer portion of the cooling plate, the top wall extending from a position adjacent the outer end of the cooling plate to a position adjacent the first lateral side of the plastic casing, and
      a pair of spaced-apart lateral walls joining the top and bottom walls,
   wherein at least the top side and the second lateral side of the plastic casing are exposed through the mouth opening of the sleeve.

11. A semiconductor array according to claim 10, wherein the top side of the plastic casing is disposed above the upper surface of the top wall.

12. A semiconductor array according to claim 10, wherein the lateral walls of the sleeve are generally rectangular and extend from a position adjacent the outer end of the cooling plate to a position adjacent the second lateral side of the plastic casing, a portion of one of the lateral walls being disposed adjacent the third lateral side of the plastic casing and a portion of the other lateral wall being disposed adjacent the fourth lateral side of the plastic casing.

13. A semiconductor array according to claim 10, wherein the top wall is substantially thicker than the bottom wall.

14. A semiconductor array according to claim 10, wherein each lateral wall of the sleeve has a rectangular portion and a sloping portion, the rectangular portion being disposed toward the outer end of the plate and the sloping portion being disposed toward the second lateral wall of the plastic casing.

15. A semiconductor array according to claim 14, wherein the sloping portion of each lateral wall is generally triangular in configuration.

16. A semiconductor array according to claim 10, wherein the top wall has a free edge adjacent the first lateral side of the plastic casing, the free edge extending from one lateral wall to the other lateral wall.

17. A semiconductor array according to claim 10, wherein the top wall is a continuous panel extending from one lateral wall to the other lateral wall.

18. A semiconductor array according to claim 10, wherein the top side of the plastic casing is entirely exposed through the mouth opening of the insulating sleeve.

19. A semiconductor array according to claim 4, wherein the top surface is a continuous panel extending from one lateral surface to the other lateral surface.

* * * * *